(12) United States Patent
Hellinger et al.

(10) Patent No.: US 10,069,212 B2
(45) Date of Patent: Sep. 4, 2018

(54) ANTENNA ARRAY HAVING A VARIABLE DIRECTIVITY CHARACTERISTIC

(71) Applicant: Robert Bosch GmbH, Stuttgart (DE)

(72) Inventors: Raphael Hellinger, Farmington Hills, MI (US); Klaus Baur, Mietingen (DE); Marcel Mayer, Leonberg (DE)

(73) Assignee: ROBERT BOSCH GMBH, St (DE)

( * ) Notice: Subject to any disclaimer, the term of this patent is extended or adjusted under 35 U.S.C. 154(b) by 439 days.

(21) Appl. No.: 14/771,879

(22) PCT Filed: Jan. 10, 2014

(86) PCT No.: PCT/EP2014/050403
§ 371 (c)(1),
(2) Date: Sep. 1, 2015

(87) PCT Pub. No.: WO2014/135291
PCT Pub. Date: Sep. 12, 2014

(65) Prior Publication Data
US 2016/0036135 A1 Feb. 4, 2016

(30) Foreign Application Priority Data
Mar. 6, 2013 (DE) .................. 10 2013 203 789

(51) Int. Cl.
*H01Q 21/12* (2006.01)
*H01Q 3/28* (2006.01)
(Continued)

(52) U.S. Cl.
CPC ............ *H01Q 21/12* (2013.01); *G01S 7/282* (2013.01); *H01Q 3/28* (2013.01);
(Continued)

(58) Field of Classification Search
CPC .... H01Q 21/12; H01Q 21/0006; H01Q 21/08; H01Q 3/28; H01Q 9/0407; H01Q 21/065; H01Q 1/3233; H03G 3/00; G01S 7/282
See application file for complete search history.

(56) References Cited

U.S. PATENT DOCUMENTS

| 4,605,931 A | * | 8/1986 | Mead | ............... H01P 5/227 333/117 |
| 4,644,360 A | * | 2/1987 | Mead | ............... H01Q 13/206 343/700 MS |

(Continued)

FOREIGN PATENT DOCUMENTS

| CN | 102170047 A | 8/2011 |
| DE | 19 857 871 | 10/2000 |

(Continued)

OTHER PUBLICATIONS

International Search Report for PCT/EP2014/050403, dated Apr. 17, 2014.
(Continued)

*Primary Examiner* — Matthew M Barker
(74) *Attorney, Agent, or Firm* — Norton Rose Fulbright US LLP; Gerard Messina

(57) ABSTRACT

An antenna array includes a first patch antenna and a second patch antenna which are oriented mutually in parallel. Each patch antenna includes a linear array of radiation elements. Adjacent radiation elements within each patch antenna are equidistantly spaced apart and are interconnected. In addition, a connecting line between adjacent first ends of the two patch antennas is provided, and the two second ends of the patch antennas are each adapted for transfer of an electrical oscillation. The spacings between the adjacent radiation elements of the first patch antenna are greater than the spacings between the adjacent radiation elements of the second patch antenna.

10 Claims, 3 Drawing Sheets

(51) Int. Cl.
*H01Q 21/00* (2006.01)
*G01S 7/282* (2006.01)
*H03G 3/00* (2006.01)
*H01Q 1/32* (2006.01)
*H01Q 21/06* (2006.01)
*H01Q 9/04* (2006.01)

(52) U.S. Cl.
CPC ........... *H01Q 21/0006* (2013.01); *H03G 3/00* (2013.01); *H01Q 1/3233* (2013.01); *H01Q 9/0407* (2013.01); *H01Q 21/065* (2013.01)

(56) References Cited

U.S. PATENT DOCUMENTS

| | | | | |
|---|---|---|---|---|
| 5,333,002 | A * | 7/1994 | Gans | H01Q 1/525 343/700 MS |
| 6,147,658 | A * | 11/2000 | Higashi | H01Q 3/12 333/167 |
| 9,190,717 | B2 | 11/2015 | Schoeberl et al. | |
| 2007/0279303 | A1 | 12/2007 | Schoebel | |
| 2013/0016001 | A1 | 1/2013 | Schoeberl et al. | |

FOREIGN PATENT DOCUMENTS

| | | |
|---|---|---|
| DE | 10 2009 029291 | 3/2011 |
| DE | 10 2010 041438 | 3/2012 |
| GB | 2080041 A | 1/1982 |

OTHER PUBLICATIONS

Hallbjorner P. et al. "Millimetre-wave switched beam antenna using multiple traveling-wave patch arrays", IEEE Proceedings: Microwaves, Antennas and Propagation, IEE, Stevenage Herts, GB, vol. 152, No. 6, Dec. 9, 2005 pp. 551-555.

* cited by examiner

ANTENNA ARRAY HAVING A VARIABLE DIRECTIVITY CHARACTERISTIC

BACKGROUND OF THE INVENTION

1. Field of the Invention

The present invention relates to the tilting of a directivity characteristic of an antenna array, e.g., an antenna array for a radar sensor.

2. Description of the Related Art

A radar sensor can be used on a motor vehicle, for example, to determine a distance between the motor vehicle and a motor vehicle traveling in front. In other specific embodiments, other objects in the surrounding field of the first motor vehicle can also be ascertained by the radar sensor. To ensure than an object is correctly sensed, respectively detected by the radar sensor, a longitudinal axis of the radar sensor should assume a predetermined angle to the horizontal plane. If the actual angle deviates from the predetermined angle, for example, due to a loading of the motor vehicle in front of or behind the center of gravity thereof, this causes the radar sensor to transmit the radar signals too far up or too far down. This is referred to as a misaligned radar sensor.

The German Patent DE 19 857 871 C1 describes one option for mechanically adjusting a radar sensor. It provides for mounting an optical mirror on the radar sensor and for using a laser source to determine the position of the mirror relative to a longitudinal axis of the motor vehicle and, if indicated, to adapt the same.

The published German Patent Application DE 10 2007 041 511 A1 describes a method for determining an angle between a longitudinal axis of the radar sensor and a longitudinal axis of the motor vehicle that provides for aiming the radar sensor at a simulated target.

Both of these discussed methods require that the radar sensor be mechanically adjusted to align the transmitting direction thereof at the desired angle relative to the longitudinal axis of the motor vehicle.

Methods are also known for determining the angle between the longitudinal axis of the radar sensor and that of the motor vehicle without using external devices. Generally, the backscattering behavior of various objects is ascertained during operation of the radar sensor, and the angle is determined therefrom. When a position of the target object is subsequently determined, the thus ascertained angle can be taken into account, whereby the object can be successfully sensed, respectively the position thereof can be determined with improved accuracy.

In the case of transmitting frequencies used by a radar sensor, what is generally referred to as a patch antenna is customarily used. Such antennae can be realized inexpensively using a process whereby structural features are produced, in particular by etching, on a substrate having high-frequency capability. A single radiation element (patch) can emit the high frequency, for example. To achieve a more concentrated bundling of the radiated high frequency, a larger aperture and thus a narrower antenna lobe can be achieved by arraying a plurality of radiation elements. If all of the radiation elements are to be fed from the same source, this can be done in parallel via a distribution network, or they can be arrayed in series. The U.S. Patent Application Publication 2007/0279303 A1 discusses such a serial feeding, for example.

Techniques are also known for influencing the main lobe direction of an antenna array through superposition. This allows oscillations having different frequencies or different phases to be superposed in a way that modifies the beam direction of the main lobe of the antenna array in a predetermined manner. However, phase shifters for modifying the phase are expensive to manufacture and not simple to operate due to the poor temperature stability thereof. Varying the frequency can, in fact, change the main beam direction, however, each frequency has another main beam direction permanently associated therewith. Also, varying the frequency typically has only little effect on the main beam direction. Therefore, in certain circumstances, adequately tilting the beam direction requires changing the frequency to the point where it is outside of a permitted frequency band. For a radar sensor, this is particularly significant in terms of automotive long-range sensing.

It is, therefore, an object of the present invention to provide an antenna array and a transmitting device that support varying the main beam direction with little outlay.

BRIEF SUMMARY OF THE INVENTION

An antenna array according to the present invention includes a first and a second patch antenna that are oriented mutually in parallel. Each patch antenna includes a linear array of radiation elements. Adjacent radiation elements of a patch antenna are equidistantly spaced apart and are interconnected. In addition, a connecting line is provided between adjacent ends of the two patch antennae, and the two remaining ends of the patch antennae are each adapted for the transfer of an electrical oscillation. The spacings between the adjacent radiation elements of the first patch antenna are greater than those of the second patch antenna.

Thus, the two patch antennae form the parallel lateral sides of a U-shaped array, the ends of the array being configured for the transfer of electrical oscillations. The spacings between the radiation elements of each patch antenna are preferably selected to induce the serial array of radiation elements to tilt the beam direction out of the orthogonal of the plane in which the patch antenna resides. The patch antennae are antiparallel arrayed on both sides, so that the tilting directions are mutually opposite. The patch antennae are fed on both sides with oscillations of the same frequency. If both oscillations have same amplitudes, then there is altogether no tilting. If the amplitude of one of the oscillations predominates, then the beam direction of the entire array is tilted in an associated direction to the top side or the bottom side of the U.

This makes it possible to control the beam direction by a relatively simple manipulation of the amplitudes of the electrical oscillations at both ends of the patch antennae. Different frequencies or phase-shifted oscillations are no longer needed. If the antenna array is used on a radar sensor on board a motor vehicle, then the main beam direction may be controllable in the vertical direction, for example. This may be done solely electrically, for which purpose, it is no longer necessary to mechanically adjust the radar sensor, respectively the antenna array. By rotating the antenna array accordingly, the main beam direction may also be changed to another direction, for example the horizontal direction.

It is thus possible, in particular, to compensate for a misalignment of an antenna array. The main beam direction of the antenna array may be optimized fully automatically in conjunction with an automatic misalignment detection.

One preferred specific embodiment provides that the radiation elements be disposed on a substrate, and that the spacings therebetween each be within the range of one half wavelength of an oscillation to be converted in the substrate.

In particular, one of the spacings may be greater than and the other smaller than the half wavelength, in order to efficiently utilize the antiparallel tendency of the main beam directions of the individual patch antennae.

Another specific embodiment provides that at least one of the patch antennae include a plurality of parallel linear arrays of radiation elements that are interconnected in parallel. A more concentrated bundling may thereby ensue in the direction that extends orthogonally to the tilting. The connecting line makes it possible for the entire aperture of all radiation elements to be used with only one source for electrical oscillations.

A transmitting device according to the present invention includes the described antenna array, an interface for connecting to an oscillation source, a first transmitting device for providing an oscillation present at the interface to the first patch antenna, and a second transmitting device for providing the oscillation present at the interface to the second patch antenna, at least one of the transmitting devices having a variable amplification factor.

An integrated transmitting device may be thereby provided that supports a tilting of the main beam direction through a simple adaptation of the amplification factor.

In one preferred specific embodiment, the amplification factor may assume one of two values. The transmitting device may thereby have an especially simple design.

In one specific embodiment, one of the values may be zero. In another specific embodiment, which may be combined with the one most recently mentioned, one of the values is one. This enables the main beam direction to already be influenced by configuring one or both transmitting devices to be switches.

In addition, the amplification factor of one of the transmitting devices may be maximally one. This makes it possible for an attenuation member, which may be readily designed as a passive circuit, to be used for the transmission.

The transmitting device may also include a control device for changing the amplification factor of at least one of the transmitting devices. Another specific embodiment provides that the control device be adapted for inversely changing the amplification factors of the two transmitting devices.

DETAILED DESCRIPTION OF THE INVENTION

Figure 1:
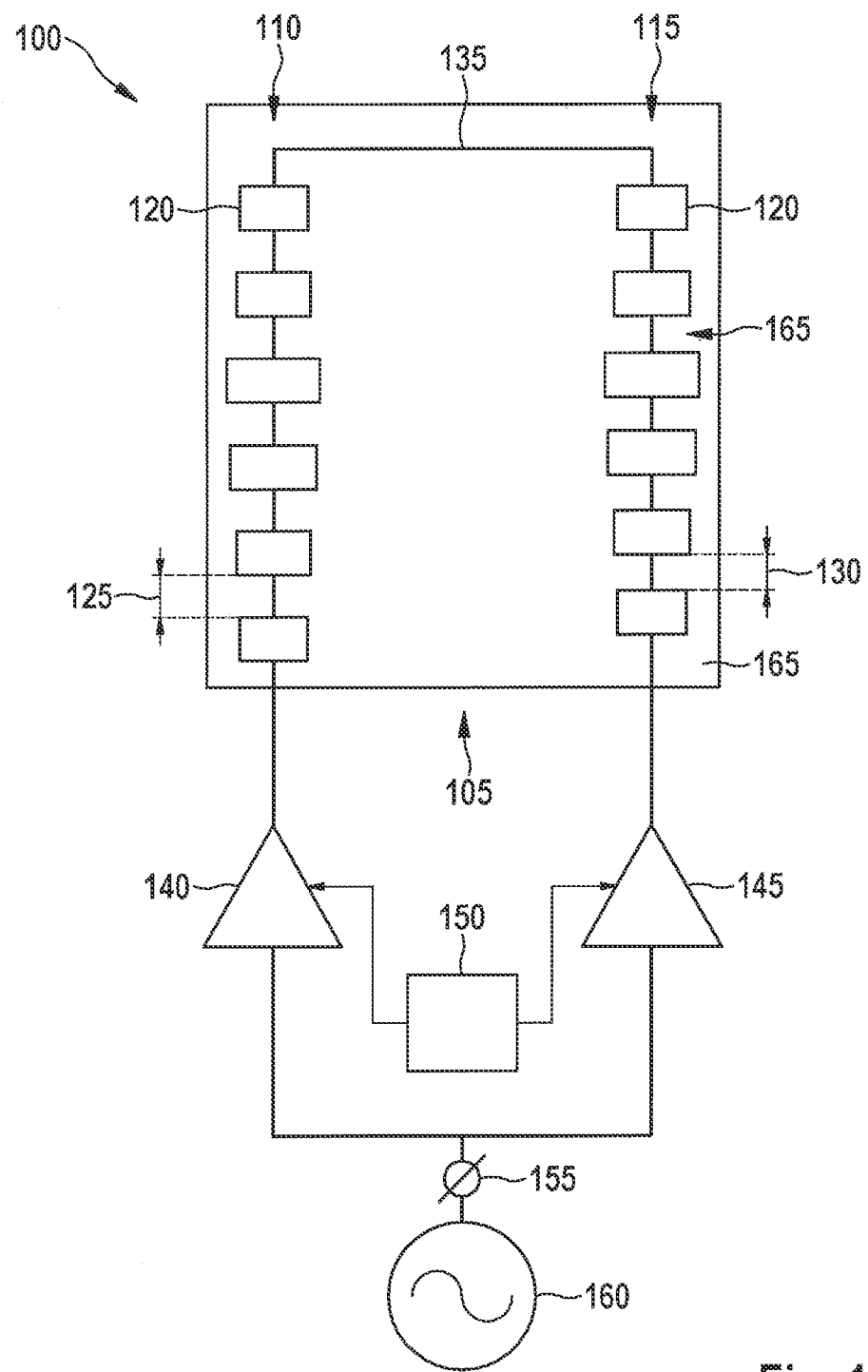
FIG. 1 shows a transmitting device having an antenna array.

FIG. 1 shows a transmitting device 100 having an antenna array 105. Antenna array 105 includes a first patch antenna 110 and a second patch antenna 115. Each patch antenna 110, 115 includes a number of radiation elements 120.

Radiation elements 120 of each patch antenna 110, 115 are serially arrayed in each instance and galvanically interconnected in series. Adjacent radiation elements 120 of first patch antenna 110 each feature a first spacing 125, and adjacent radiation elements 120 of second patch antenna 115 each feature a second spacing 130. All first spacings 125 of first patch antenna 110, and all spacings 130 of second patch antenna 115 are mutually identical, but first spacings 125 are greater than second spacings 130. In one alternative specific embodiment, in place of spacings 125 and 130, galvanic connecting elements may also each be configured to differ in length in the described manner between adjacent radiation elements 120 of different patch antennae 110 and 115.

Thus, the two patch antennae 110 and 115 are disposed side-by-side in parallel, and the ends (at the top in FIG. 1) are galvanically interconnected by a connecting line 135.

In addition, transmitting device 100 includes a first transmitting device 140 that is connected to the free end (at the bottom in FIG. 1) of first patch antenna 110, and a second transmitting device 145 that is connected to the second end of second patch antenna 115. At least one of transmitting devices 140, 145 features a controllable amplification factor. The amplification factor may be greater than one, the transmitting device including an active amplifier; it may be between zero and one, the transmitting device including an attenuator; or it may be alternatively zero or one, the transmitting device including a controllable switch. In the illustrated specific embodiment, both transmitting devices 140, 145 are controllable, and a control device 150 is provided for changing the amplification factors of transmitting devices 140, 145. One specific embodiment provides that the amplification factors be inversely changed.

Inputs of transmitting devices 140, 145 are connected to an interface 155 that is adapted for receiving an electrical oscillation from an oscillation source 160. Oscillation source 160 may also be included in transmitting device 100.

To clarify the principle of operation of antenna array 105, a transmitting frequency of 76.5 GHz is assumed here exemplarily. The antenna array including patch antennae 110 and 115, as well as connecting line 135 may be deposited on a substrate 165, for example of the Rogers RO 3003 type. The wave propagation is carried out in substrate 165 in such a way that, at the predefined frequency, the wavelength is in the range of approximately 2.2 mm. At 1.19 mm, first spacings 125 are somewhat larger than the half wavelength, and, at 1.04 mm, second spacings 130 are somewhat smaller.

If the amplification factors of transmitting devices 140, 145 are identical, and if oscillation source 160 supplies the mentioned transmitting frequency, then the main beam direction of first patch antenna 110 in FIG. 1 is tilted upwards in the direction of connecting line 135 due to selected spacings 125. The main beam direction of second patch antenna 115 is likewise tilted due to selected spacings 130, but in the opposite direction, thus away from connecting line 135. The electromagnetic oscillations emitted by patch antennae 110 and 115 are mutually superimposed in a way that induces the tiltings to compensate for one another, and the common main beam direction to lie orthogonally to the plane of the paper.

For example, if the amplification factor of first transmitting device 140 is greater than that of second transmitting device 145, then the tilting effect leading to connecting line 135 predominates, and the common main beam direction is tilted in this direction. Conversely, if the amplification factor of second transmitting device 145 is greater than that of first transmitting device 140, then common main beam direction of antenna array 105 is tilted away from the direction of connecting line 135.

Transmitting device 100 or portions thereof may be integrated in a radar sensor, in particular for use in a motor vehicle for long-range sensing further than approximately 10 m. A customary radar sensor may already include transmitting devices 140, 145 and oscillation source 160, allowing the remaining required elements to be implemented with little additional outlay.

Figure 2:
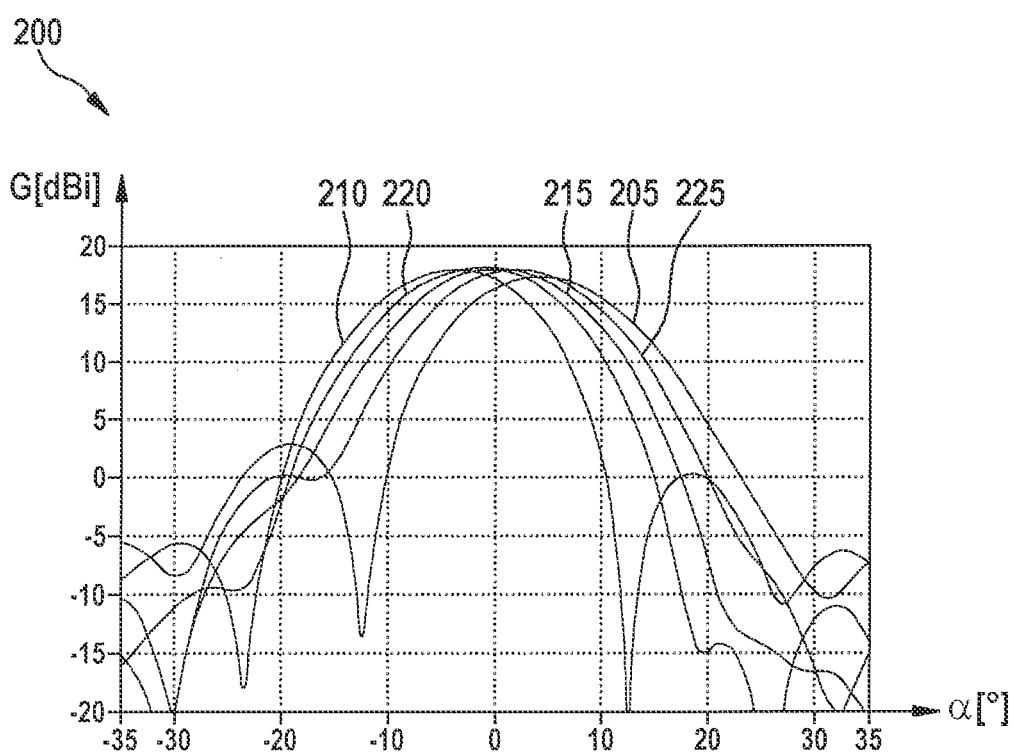
FIG. 2 shows a gain diagram of the transmitting device of FIG. 1.

FIG. 2 shows a gain diagram 200 of transmitting device 100 of FIG. 1. In the horizontal direction, a tilt angle α is entered in degrees along the direction that is vertical in FIG. 1; in the vertical direction, an antenna gain G is marked in dBi.

A first curve 205 is obtained when one is selected for the amplification factor of first transmitting device 140, and zero is selected for the second amplification factor of second transmitting device 145. In this context, the main beam direction resides at approximately +4°.

A second curve 210 is obtained when zero is selected for the amplification factor of first transmitting device 140, and one is selected for the amplification factor of second transmitting device 145. In this context, the main beam direction resides at approximately −4°.

A third curve 215 is obtained when one is selected for both amplification factors; the main beam direction then resides at approximately 0°.

If 0.5 is selected as the amplification factor for first transmitting device 140, and one is selected for the amplification factor of second transmitting device 145, then a fourth curve 220 is obtained that features a main beam direction of approximately −2°.

If, on the other hand, one is selected as the amplification factor for first transmitting device 140, and 0.5 is selected for the amplification factor of second transmitting device 145, then a fifth curve 225 is obtained whose main beam direction is approximately +2°.

Thus, based on the selected example, the main beam direction of antenna array 105, respectively of transmitting device 100 may be tilted by approximately ±4°. In this context, the selected amplification factors are readily achieved and require only little outlay for circuitry.

Figure 3:
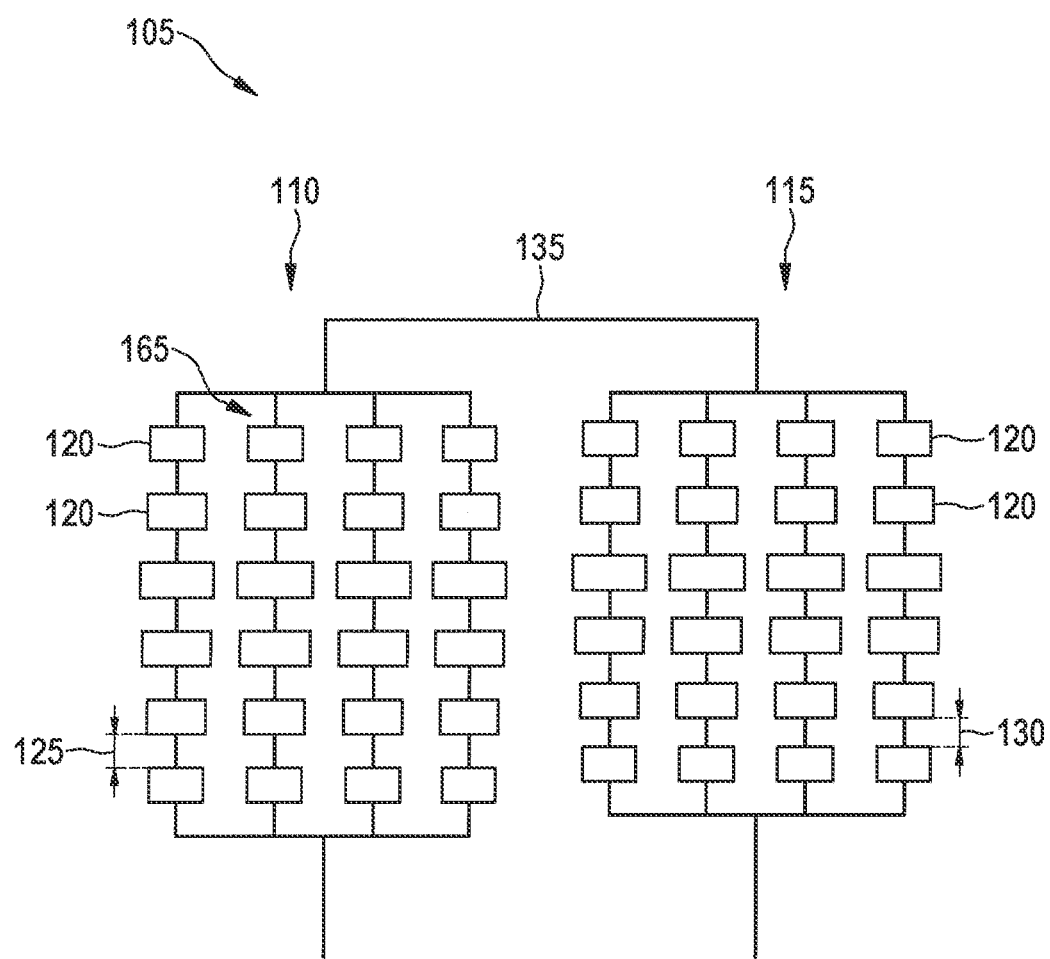
FIG. 3 shows another specific embodiment of the antenna array of FIG. 1.

FIG. 3 shows another specific embodiment of antenna array 105 of FIG. 1. Each patch antenna 110, 115 is composed of a number of parallel arrayed and parallel interconnected patch antennae in accordance with the representation of FIG. 1. The spacings of adjacent radiation elements 120 in the individual series of first patch antenna 110 correspond to first spacing 125, and those of radiation elements 120 of second patch antenna 115 to second spacing 130 from FIG. 1.

The above described control allows electrical adjustment of the main beam direction of antenna array 105 in the vertical direction in FIG. 3. By connecting a plurality of series of radiation elements 120 in parallel to form a first patch antenna 110, respectively a second patch antenna 115, a directivity may be improved in the direction shown as a horizontal direction in FIG. 1. Moreover, an enlarged aperture of antenna array 105 may be used.

What is claimed is:

1. An antenna array, comprising:
a first patch antenna; and
a second patch antenna;
wherein:
the first and second patch antennas are arranged parallel to each other;
the first patch antenna includes a respective linear array of radiation elements (a) that are serially interconnected to each other from a second end of the first patch antenna to a first end of the first patch antenna and (b) each pair of immediately adjacent ones of which are spaced apart from each other by a same first equidistant spacing;
the second patch antenna includes a respective linear array of radiation elements (a) that are interconnected to each other from a second end of the second patch antenna to a first end of the second patch antenna and (b) each pair of immediately adjacent ones of which are spaced apart from each other by a same second equidistant spacing that is less than the first equidistant spacing;
the first ends of the first and second patch antennas are adjacent to each other and are connected to each other by a connecting line; and
the second ends of the first and second patch antennas are each configured for transfer of an electrical oscillation to the respective patch antenna for propagation of the electrical oscillation along the radiation elements of the respective patch antenna towards the respective first end of the respective patch antenna.

2. The antenna array as recited in claim 1, wherein each of at least one of the first and second patch antennas includes multiple linear sub-arrays of radiation elements, the multiple linear sub-arrays being interconnected in parallel to each other.

3. A transmitting device, comprising:
an antenna array including a first patch antenna and a second patch antenna;
an interface connected to an oscillation source;
a first transmitting device;
a second transmitting device; and
a control device;
wherein:
the first and second patch antennas are arranged parallel to each other;
the first patch antenna includes a respective linear array of radiation elements that are interconnected to each other and each pair of immediately adjacent ones of which are spaced apart from each other by a same first equidistant spacing;
the second patch antenna includes a respective linear array of radiation elements that are interconnected to each other and each pair of immediately adjacent ones of which are spaced apart from each other by a same second equidistant spacing that is less than the first equidistant spacing;
first ends of the first and second patch antennas are connected to each other by a connecting line;
the first transmitting device is configured to provide an oscillation of the oscillation source that is present at the interface to a second end of the first patch antenna;
the second transmitting device is configured to provide the oscillation of the oscillation source that is present at the interface to a second end of the second patch antenna;
at least one of the first and second transmitting devices includes a respective amplifier to modify the oscillation present at the interface by a variable amplification factor; and
the control device is configured to control the respective amplifier to vary the amplification factor.

4. The antenna array as recited in claim 3, wherein:
the radiation elements are arrayed on a substrate;
the first equidistant spacing is larger than half of a wavelength of the oscillation present at the interface; and
the second equidistant spacing is less than half of the wavelength of the oscillation present at the interface.

5. The transmitting device as recited in claim 4, wherein the amplifier is configured to alternatively set the amplification factor to each of two values.

6. The transmitting device as recited in claim 5, wherein one of the two values is zero.

7. The transmitting device as recited in claim 6, wherein one of the two values is one.

8. The transmitting device as recited in claim 5, wherein a respective value to which the respective amplifier of at least one of the two transmitting devices is configured to set the amplification factor is maximally one.

9. The antenna array as recited in claim 4, wherein each of the first and second transmitting devices includes the respective amplifier to independently modify the oscillation present at the interface by the amplification factor, by independently setting a respective value of the amplification factor.

10. The antenna array as recited in claim 4, wherein each of at least one of the first and second patch antennas includes multiple linear sub-arrays of radiation elements, the multiple linear sub-arrays being interconnected in parallel to each other.

\* \* \* \* \*